United States Patent
Lou

(10) Patent No.: US 6,200,881 B1
(45) Date of Patent: Mar. 13, 2001

(54) METHOD OF FORMING A SHALLOW TRENCH ISOLATION

(75) Inventor: Chine-Gie Lou, Hsinchu Hsien (TW)

(73) Assignee: Worldwide Semiconductor Manufacturing Corp., Hsinchu (TW)

( * ) Notice: Subject to any disclaimer, the term of this patent is extended or adjusted under 35 U.S.C. 154(b) by 0 days.

(21) Appl. No.: 09/359,415

(22) Filed: Jul. 23, 1999

(51) Int. Cl.$^7$ .................................................. H01L 21/76
(52) U.S. Cl. ........................ 438/424; 438/296; 438/427
(58) Field of Search .................................. 438/296, 424, 438/427

(56) References Cited

U.S. PATENT DOCUMENTS

| | | | |
|---|---|---|---|
| 4,983,226 | * 1/1991 | Hunter et al. | 148/33.2 |
| 5,506,168 | * 4/1996 | Morita et al. | 438/424 |
| 5,561,073 | * 10/1996 | Jerome et al. | 438/404 |
| 5,780,346 | * 7/1998 | Arghavani et al. | 438/296 |
| 5,786,263 | * 7/1998 | Perera | 438/424 |
| 5,795,811 | * 8/1998 | Kim et al. | 438/404 |
| 5,801,082 | * 9/1998 | Tseng | 438/424 |
| 5,940,717 | * 8/1999 | Rengarajan et al. | 438/435 |
| 5,989,977 | * 11/1999 | Wu | 438/424 |
| 5,989,978 | * 11/1999 | Peidous | 438/424 |
| 6,057,209 | * 5/2000 | Garnder et al. | 438/424 |

* cited by examiner

Primary Examiner—Charles Bowers
Assistant Examiner—David S Blum

(57) ABSTRACT

The present discloses a method of forming shallow trench isolation to prevent the dishing effect, the corner effect and provide an effective endpoint detection. The method includes these steps below. A pad oxide layer is formed on a semiconductor substrate. A first silicon nitride layer is formed on the pad oxide layer. A trench is formed in the substrate. A liner layer is formed on sidewalls and a bottom of the trench. A second silicon nitride layer is formed on the first silicon nitride layer and the liner layer. A polysilicon layer is formed on the second silicon nitride layer. A first silicon dioxide layer is formed on said polysilicon layer, thereby filling the trench with the first silicon dioxide layer. The first silicon dioxide layer is polished by performing a chemical mechanical polishing with a poly slurry. The polysilicon layer is oxidized to form a second silicon dioxide layer. The first silicon nitride layer and the second silicon nitride layer are removed. Silicon nitride spacers are formed on corners of the silicon dioxide protrusion and the second silicon dioxide layer. The pad oxide layer is removed. Finally, the silicon nitride spacers are removed.

20 Claims, 5 Drawing Sheets

METHOD OF FORMING A SHALLOW TRENCH ISOLATION

BACKGROUND OF THE INVENTION

1. Field of the Invention

The present invention relates to a method of forming semiconductor device, and more particularly to a method of forming shallow trench isolation (STI).

2. Description of the Prior Art

In the integrated circuit industry today, there are in general hundreds of thousands of semiconductor devices built on a single chip. Every device on the chip must be electrically isolated to ensure that they operate independently without interfering with each other. The art of isolating semiconductor devices then becomes one important aspect of modern metaloxide-semiconductor (MOS) integrated circuit technology for the separation of different devices or different functional regions. With the semiconductor devices having high integration, improper isolation among devices will cause current leakage and then leads to significant power consumption. In addition, improper isolation may result in temporary or permanent damage of the electrical circuit.

One of the most well known techniques for isolation is local oxidation of silicon (LOCOS) which provides the isolation by oxidizing the silicon substrate to create silicon dioxide regions among active devices or functional regions. The benefits of LOCOS include simplified process and low cost because the silicon substrate is easy to be oxidized into silicon dioxide. This benefits of simplified process makes LOCOS to be the most widely used isolation technique in very large scale integrated (VLSI) circuit. However, due to the tendency for the manufacture of semiconductor integral circuit to high integration, LOCOS encounters the limitation in its scalability.

The trench isolation, or, named the shallow trench isolation (STI), is another isolation technique developed especially for semiconductor chip with high integration. Trenches are formed in the semiconductor substrate by recessing the substrate deep enough for isolation and refilling with insulating material to provide the isolation among active devices or different well regions. In general, trench isolation is more suitable for the semiconductor device having high integration in comparison with LOCOS isolation.

For deep sub-micron CMOS generation, the conventional LOCOS isolation suffers from difficulty such as large lateral extension caused by bird's beak effect, non-planarity, local field oxide thinning effect, and stress-induced silicon defects. The key challenges to LOCOS scaling are field oxide layer thinning at narrow dimension, bird's beak formation, and field-implant encroachment. For future CMOS technology, an effective device isolation method that provides abrupt transitions to active device regions with minimum impact on device characteristics or topography will be required. They come to the conclusions that STI is a more direct method of meeting these requirements.

Generally, traditional method of forming STI includes these steps of follows. A pad oxide layer is formed on a semiconductor substrate by thermal oxidation. A nitride oxide layer is formed on the pad oxide layer. A photoresistor is coated on the nitride oxide layer. A patterned photoresistor is formed, by photolithography, to define the region desired to form trenches. The nitride oxide layer and the pad oxide layer are etched to form a patterned nitride layer and a patterned pad oxide layer. Then, the region desired to form trenches is exposed. The region desired to form trenches is then anisotropically etched to form the trenches by using the patterned photoresistor as a mask. A silicon dioxide layer is formed, by CVD, on the nitride layer and then the trenches are filled with the silicon dioxide. The silicon dioxide layer is polished by CMP to achieve global planarization. Thereafter, the nitride layer is removed. Finally, the pad oxide layer is remove by diluted solution of hydrofluoric acid (DHF). Thus, fabricating process of the shallow trench isolation (STI) is accomplished.

However, the great difficulty that the above traditional method encounters is described as follows.

(a) During the CMP process, the polishing rate of the silicon dioxide layer is higher than that of the nitride oxide layer. Thus, it leads to the dishing effect.

(b) During the CMP process, the ratio of the polishing selectivity of the silicon dioxide layer to the nitride oxide layer is about 3 to 5. As a result, the endpoint of the CMP process is difficult to be detected.

(c) During the pad oxide layer is removed by wet etching, the removing rate of the pad oxide layer is lower than that of the silicon dioxide layer because the pad oxide layer is formed by thermal oxidation but the silicon dioxide layer is formed by CVD, respectively. Thus, the corner effect is suffered and thereby results in a higher intensity of the sub-threshold current. That is, it renders that the MOS transistors formed subsequently fail to obey the predetermined design of the electrical circuit and thereby, yield is down.

SUMMARY OF THE INVENTION

The traditional method of forming STI cannot avoid the dishing effect, the corner effect and provide an effective endpoint detection of CMP. Therefore, the main object of the present invention is to provide a method of forming shallow trench isolation (STI) can overcome aforementioned problems.

The above object of the present invention is achieved by the steps described below. A pad oxide layer is formed on a semiconductor substrate. A first silicon nitride layer ($Si_3N_4$) is formed on the pad oxide layer. A trench is formed in the substrate.

After the trench is formed, a liner layer is formed on sidewalls and a bottom of the trench. A second silicon nitride layer is formed on the first silicon nitride layer and the liner layer. A polysilicon layer is formed on the second silicon nitride layer. A first silicon dioxide layer is formed on said polysilicon layer, thereby filling the trench with the first silicon dioxide layer. The first silicon dioxide layer is polished by performing chemical mechanical polishing with a poly slurry to form a silicon dioxide protrusion. The poly slurry enables the polishing rate of the polysilicon layer to be higher than that of the first silicon dioxide layer. The poly slurry also enables the polishing rate of the polysilicon layer to be higher than that of the second silicon nitride layer. As a result, the dishing effect is eliminated and the second silicon nitride layer can serve as the polishing-stop layer.

A part of the polysilicon layer is oxidized to form a second silicon dioxide layer. Thereafter, the first silicon nitride layer and a part of the second silicon nitride layer are removed. Silicon nitride spacers are formed on corners of the silicon dioxide protrusion and the second silicon dioxide layer. The pad oxide layer is removed. Finally, the silicon nitride spacers are removed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention proposes a method of forming shallow trench isolation. The method described here includes many process steps well known in the art like photolithography, etching or chemical vapor deposition (CVD) which are not discussed in detail. In addition, the present invention utilizes the polishing selectivity of a poly slurry varied with different material to avoid the dishing effect and make endpoint detection available. Moreover, during a pad oxide layer is removed, nitride spacers are used to avert the corner effect. Thus, the sub-threshold current caused by the corner effect is eliminated.

Figure 1:
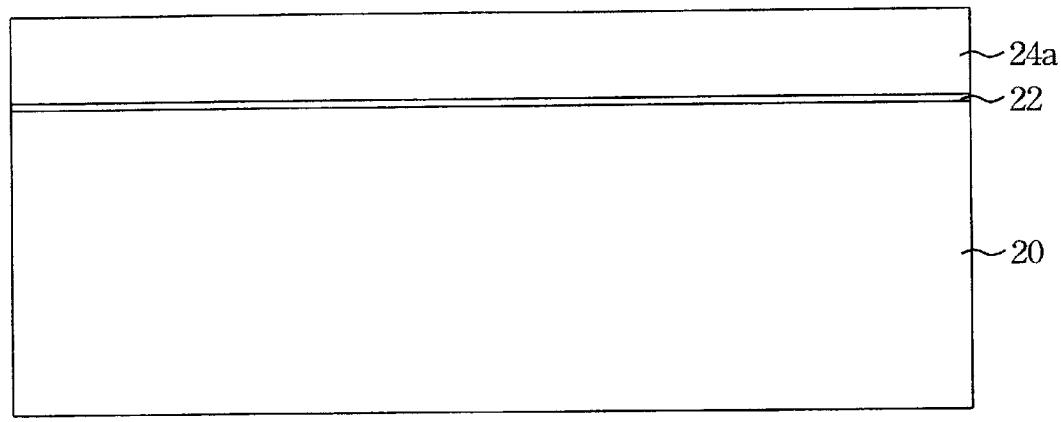
FIG. 1 is a cross-sectional view of a semiconductor substrate illustrating the step of forming a pad oxide layer and a first silicon nitride layer.

Referring to FIG. 1, a single crystal silicon substrate 20 with a (100) crystallographic orientation is provided. A pad oxide layer 22, having thickness of about 150–300 angstroms, is formed on the substrate 20. It is preferred that the pad oxide layer is formed by thermal oxidation in an oxygen-containing ambient. Then, a first silicon nitride layer 24a is formed on the pad oxide layer 22 to act as a mask during the substrate 20 is etched subsequently. The first silicon nitride layer 24a has a thickness of about 1500–2000 angstroms and can be deposited by LPCVD at the temperature of about 650–750° C.

Figure 2:
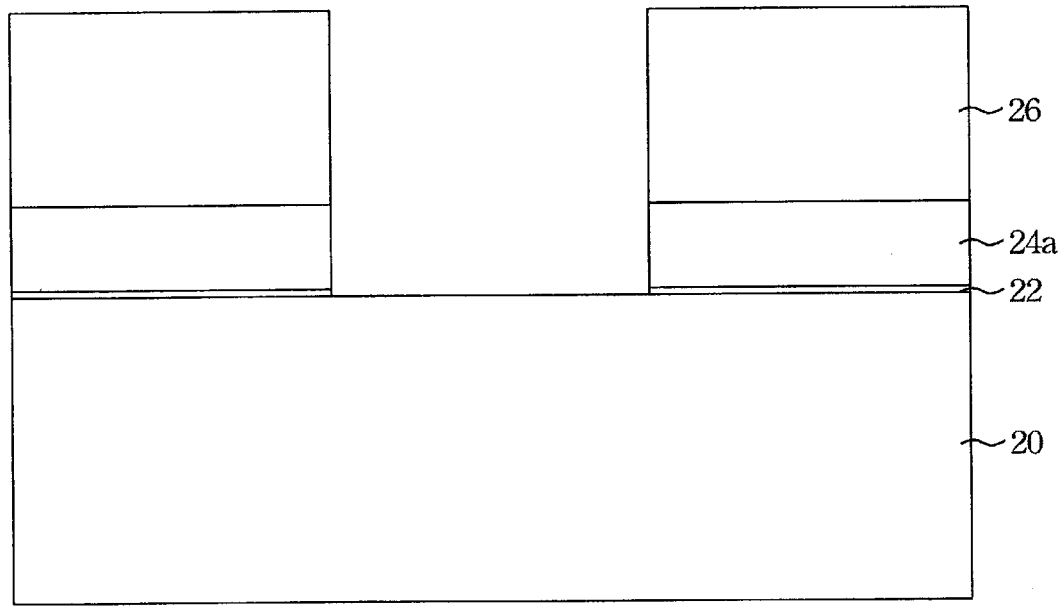
FIG. 2 is a cross-sectional view of a semiconductor substrate illustrating the step of forming a photoresistor layer on the first silicon nitride layer.

Referring to FIG. 2, a patterned photoresistor 26 is formed on the first silicon nitride layer 24a to define a region desired to form a trench. Then, an anisotropic etching is performed to etch the first silicon nitride layer 24a and the pad oxide layer 22, by using the patterned photoresistor 26 as a mask, to form a patterned first silicon nitride layer 24a. Thus, the region desired to form a trench is exposed. The anisotropic etching includes a reactive ion etching (RIE) and the plasma gas containing fluoride such as $CF_4$, $CHF_3$, $C_2F_6$ or $C_3F_8$ is preferable for this anisotropic etching.

Figure 3:
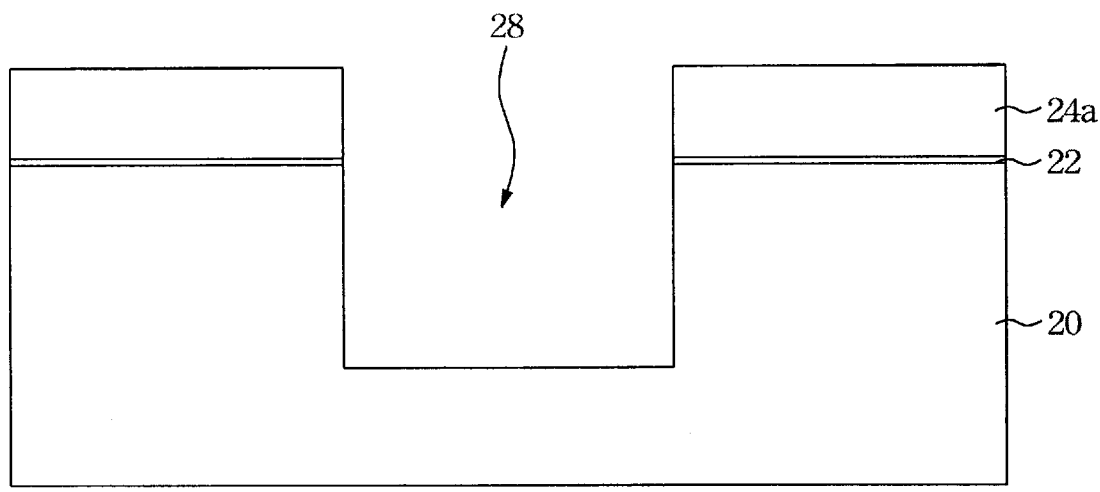
FIG. 3 is a cross-sectional view of a semiconductor substrate illustrating the step of forming a trench.

Referring to FIG. 3, after the patterned photoresistor 26 is removed, another anisotropic etching is performed to etch the substrate 20, by using the patterned first silicon nitride layer 24a as a mask, to form a trench 28 having enough depth for isolation. The depth of the trench 28 is about 0.35–0.5 $\mu$m. The anisotropic etching includes a reactive ion etching (RIE) and the plasma gas containing fluoride such as $Cl_2$, $BCl_3$, HBr, $SF_6$ or $SiCl_4$ is preferable for this anisotropic etching. A thermal oxidization is carried out at the temperature of about 900–1100° C. to form a liner layer 25 on the bottom and sidewalls of the trench 28 to recover the substrate 20 damaged due to the previous anisotropic etching. Simultaneously, the corners of the trench 28 are rounded.

Figure 4:
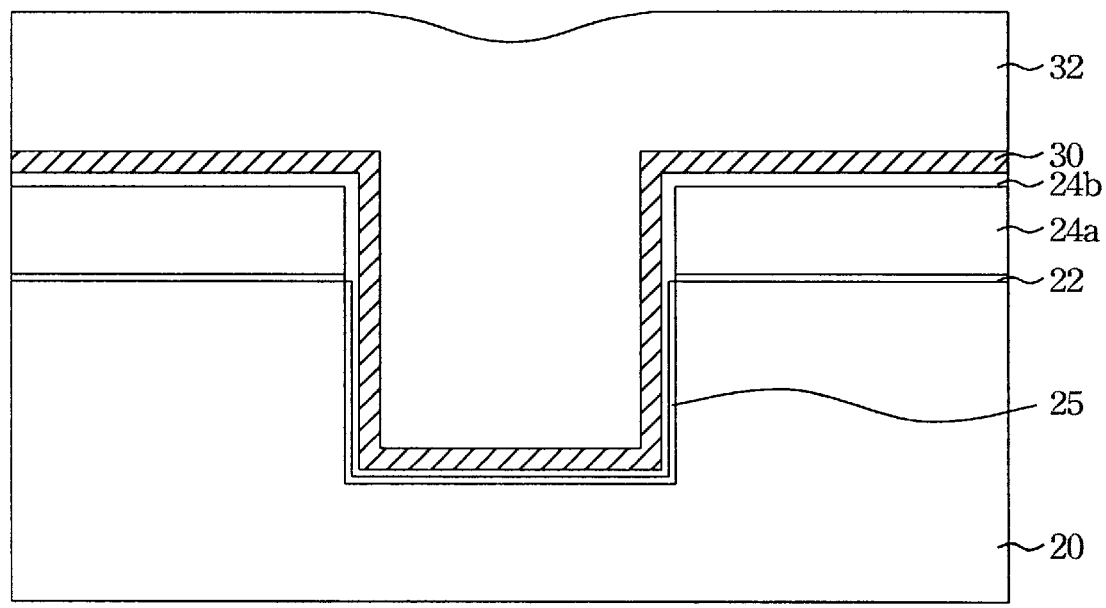
FIG. 4 is a cross-sectional view of a semiconductor substrate illustrating the step of forming a first silicon dioxide layer and a polysilicon layer on the second silicon nitride layer.

Referring to FIG. 4, a second silicon nitride layer 24b, having a thickness of about 30–100 angstroms, is formed on the substrate 20. Additionally, an undoped polysilicon layer 30, having a thickness of about 100–700 angstroms, is formed on the second silicon nitride layer 24b. Then, a first silicon dioxide layer 32 is formed on the undoped polysilicon layer 30 and fills the trench. The suitable method of forming the first silicon dioxide layer 32 includes LPCVD, SACVD or HDPCVD. The first silicon dioxide layer 32 is formed of the material selected from TEOS-oxide (tetra-ethyl-ortho-silicate-oxide); BPSG, PSG, BSG or USG.

Figure 5:
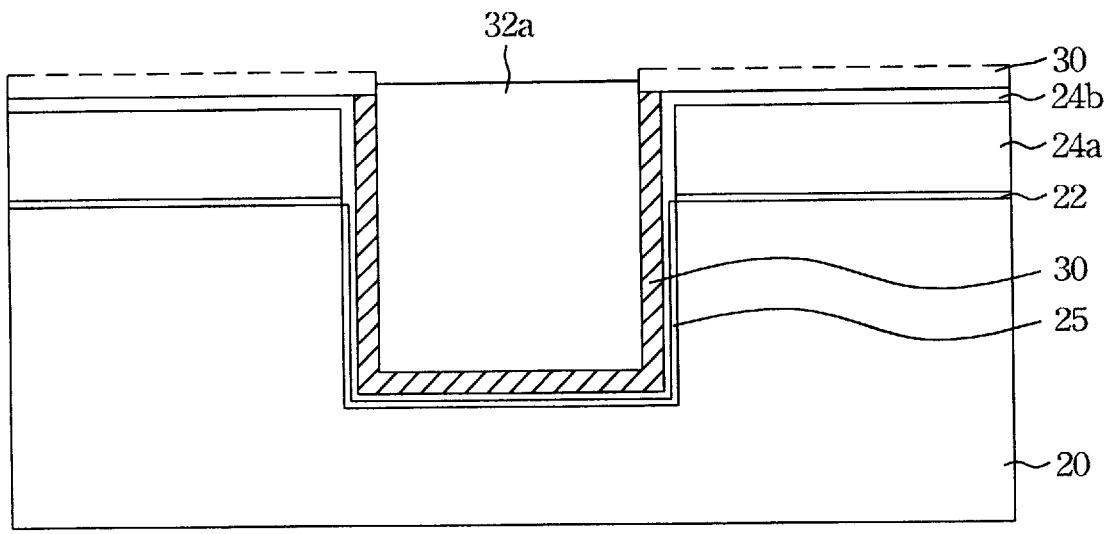
FIG. 5 is a cross-sectional view of a semiconductor substrate illustrating the step of chemical mechanical polishing the first silicon dioxide layer.

Referring to FIG. 5, a portion of the first silicon dioxide layer 32 exceeding the surface of the second silicon nitride layer 24b is substantially removed, by a chemical mechanical polishing (CMP). It is worthy noting that during the CMP step, a poly slurry is utilized. The poly slurry renders the polishing rate of polysilicon material is larger than that of silicon dioxide material. The preferred ratio of the polishing selectivity of polysilicon layer to that of silicon dioxide layer is about 30–60. Additionally, the poly slurry also renders the polishing rate of polysilicon material is larger than that of silicon nitride material. It is preferred that the ratio of the polishing selectivity of polysilicon material to that of silicon nitride material is about 40–100. That is, while the polysilicon layer 30 and the first silicon dioxide layer 32 are being polished, the polishing rate of the polysilicon layer 30 is higher than that of the first silicon dioxide layer 32. Thus, after the polysilicon layer 30 is removed completely, a silicon dioxide protrusion 32a is formed and protrudes above the surface of the second silicon nitride layer 24b. Thereby, the dishing effect is avoided. Furthermore, the polishing rate apparently varies when the polysilicon layer 30 is completely removed and the second silicon nitride layer 24b is initially polished. Hence the apparent variation in the polishing rate can serve as an endpoint detection of the CMP step.

Figure 6:
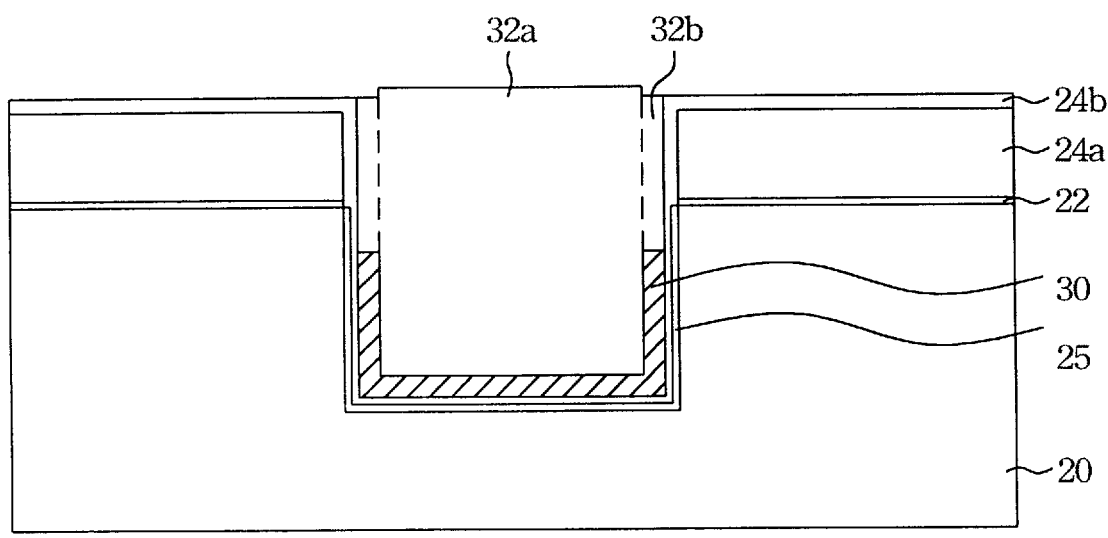
FIG. 6 is a cross-sectional view of a semiconductor substrate illustrating the step of transferring the polysilicon layer into a second silicon dioxide layer.

Referring to FIG. 6, although the CMP step is accomplished, a part of the polysilicon layer 30 still remains on the sidewalls and bottom of the trench. An oxidization step is performed to transfer the part of the polysilicon layer 30 into a second silicon dioxide layer 32b. Alternatively, a part of the polysilicon layer 30 on the sidewalls is transferred into the second silicon dioxide layer 32b. A thermal oxidization is preferred for the oxidization step.

Figure 7:
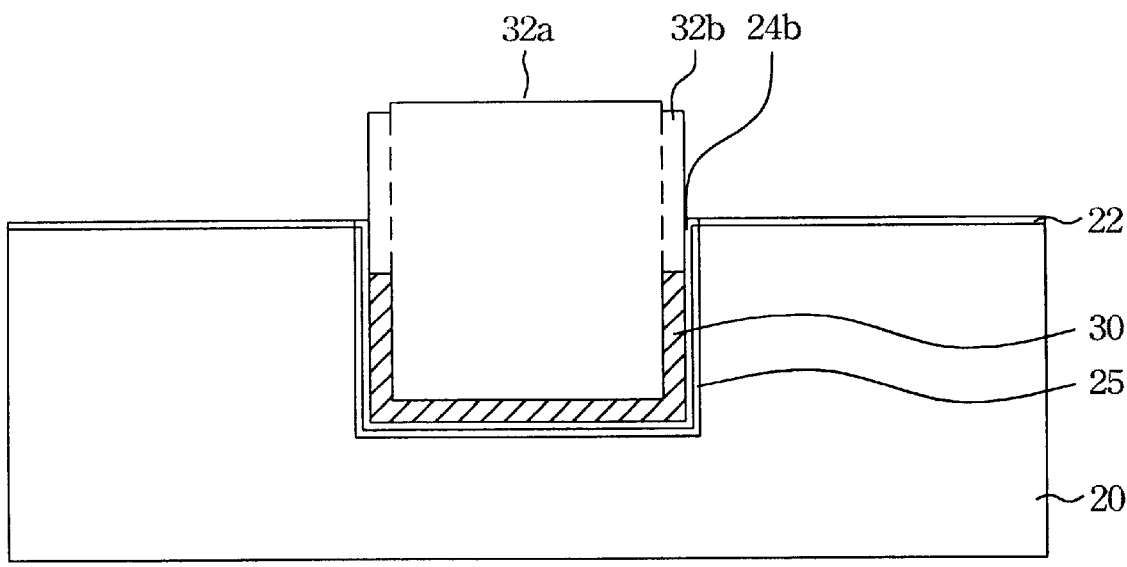
FIG. 7 is a cross-sectional view of a semiconductor substrate illustrating the step of removing the first silicon nitride layer and second silicon nitride layer.

Referring to FIG. 7, the first silicon nitride layer 24a and a part of the second silicon nitride layer 24b are removed by hot phosphoric acid.

Figure 8:
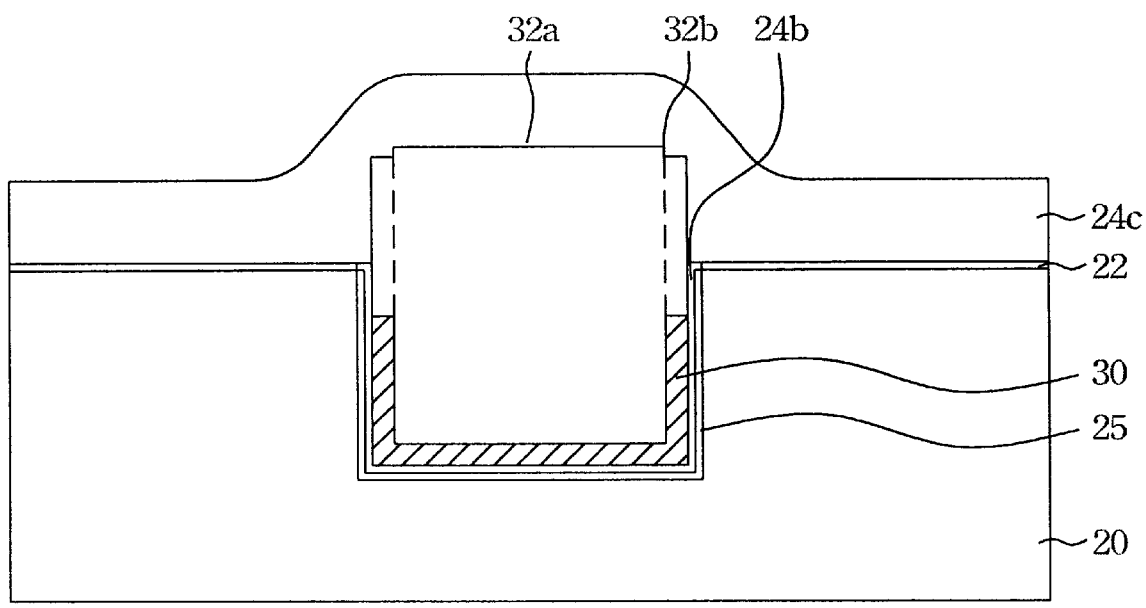
FIG. 8 is a cross-sectional view of a semiconductor substrate illustrating the step of forming a third silicon nitride layer on the substrate.

Referring to FIG. 8, a third silicon nitride layer 24c is formed to cover the pad oxide layer 22, the second silicon nitride layer 24b, silicon dioxide protrusion 32a and the second silicon dioxide layer 32b. The method of forming the third silicon nitride layer 24c includes LPCVD.

Figure 9:
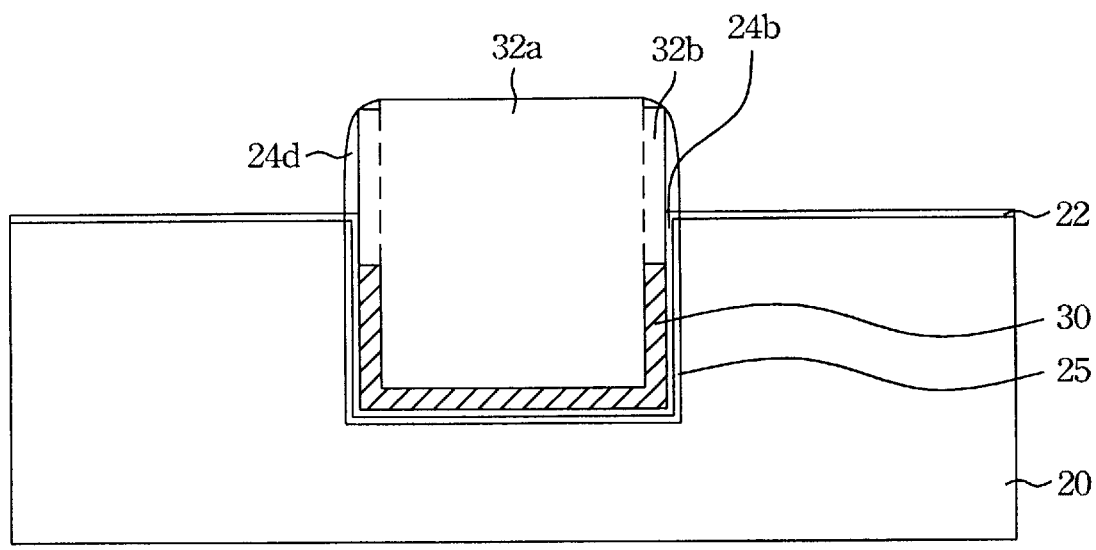
FIG. 9 is a cross-sectional view of a semiconductor substrate illustrating the step of forming silicon nitride spacers.

Referring to FIG. 9, after the third silicon nitride layer 24c is formed, an anisotropic etching is performed to form silicon nitride spacers 24d covering the corners of the silicon dioxide protrusion 32a and the second silicon dioxide layer 32b. A plasma gas containing fluoride such as $CF_4$, $CHF_3$, $C_2F_6$ or $C_3F_8$ is preferable for this anisotropic etching.

Figure 10:
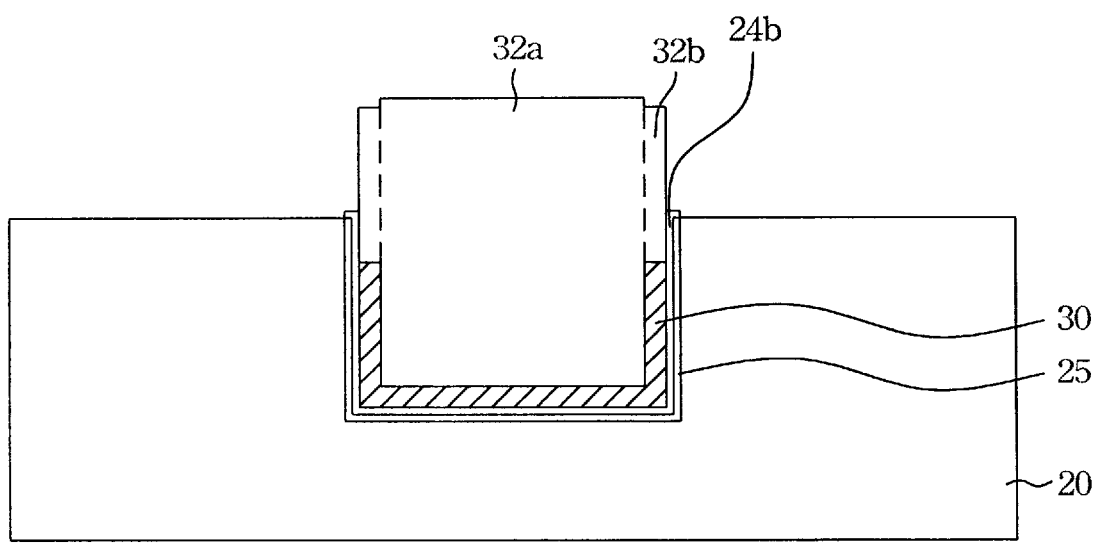
FIG. 10 is a cross-sectional view of a semiconductor substrate illustrating the step of removing the pad oxide layer and the silicon nitride spacers.

Referring to FIG. 9 and FIG. 10, after silicon nitride spacers 24d is formed, a stripping step is performed to remove the pad oxide layer 22. The preferred method and etchant of removing the pad oxide layer 22 are wet etching and the diluted solution of hydrofluoric acid (DHF), respectively. Note that the corners of the silicon dioxide protrusion 32a and the second silicon dioxide layer 32b are covered with the silicon nitride spacers 24d, so the problem caused by corner effect can be solved. Finally, the silicon nitride spacers 24d are removed and then the fabricating process of shallow trench isolation is accomplished.

In accordance with the description above, the present invention indeed prevents the dishing effect, the corner effect and provides an effective endpoint detection of the CMP process.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method of forming shallow trench isolation (STI) in a semiconductor substrate, comprises:

forming a pad oxide layer on said semiconductor substrate;

forming a first silicon nitride layer on said pad oxide layer;

patterning said first silicon nitride layer to define a trench region;

etching said semiconductor substrate by using said patterned first silicon nitride layer as a mask to form a trench in said semiconductor substrate;

forming a liner layer on sidewalls and a bottom of said trench;

forming a second silicon nitride layer on said first silicon nitride layer and said liner layer;

forming a polysilicon layer on said second silicon nitride layer;

forming a first silicon dioxide layer on said polysilicon layer, thereby filling said trench with said first silicon dioxide layer;

performing a chemical mechanical polishing to said first silicon dioxide layer using a slurry, said slurry enabling a polishing rate of a polysilicon to be higher than that of a silicon dioxide, and a polishing rate of said polysilicon to be higher than that of silicon nitride, said second silicon nitride layer acting as a polishing-stop layer, thereby a silicon dioxide protrusion formed above a surface of said second silicon nitride layer;

oxidizing said polysilicon layer to form a second silicon dioxide layer;

removing said first silicon nitride layer and said second silicon nitride layer;

forming silicon nitride spacers on corners of said silicon dioxide protrusion and said second silicon dioxide layer;

removing said pad oxide layer; and removing said silicon nitride spacers.

2. The method according to claim 1, wherein said step of forming a patterned first silicon nitride layer comprises:

forming a photoresist layer on said first silicon nitride layer;

forming a patterned photoresist layer to define a trench region;

etching said first silicon nitride layer and said pad oxide layer to form a patterned first silicon nitride layer to expose said trench region by using said patterned photoresist layer; and removing said patterned photo resist layer.

3. The method according to claim 1, wherein said second silicon nitride layer has a thickness of about 30–100 angstroms.

4. The method according to claim 1, wherein said polysilicon layer has a thickness of about 100–700 angstroms.

5. The method according to claim 1, wherein said slurry comprises a poly slurry.

6. The method according to claim 5, wherein said poly slurry enables a ratio of a polishing selectivity of said polysilicon layer to that of said first silicon dioxide layer to be about 30–60.

7. The method according to claim 5, wherein said poly slurry enables a ratio of a polishing selectivity of said polysilicon layer to that of said second silicon nitride layer to be about 40–100.

8. The method according to claim 1, wherein said polysilicon layer is transferred into said second silicon dioxide layer by performing thermal oxidization.

9. The method according to claim 1, wherein said step of forming silicon nitride spacers comprises:

forming a third silicon nitride layer on said pad oxide layer, said silicon dioxide protrusion and said second silicon dioxide layer; and anisotropic etching said third silicon nitride layer.

10. The method according to claim 9, wherein said third silicon nitride layer is formed by LPCVD.

11. The method according to claim 1, wherein said silicon nitride spacers are removed by hot phosphoric acid.

12. A method of forming shallow trench isolation (STI) in a semiconductor substrate, comprises:

forming a pad oxide layer on said semiconductor substrate;

forming a first silicon nitride layer on said pad oxide layer;

forming a patterned photoresist layer on said first silicon nitride layer to define a trench region;

etching said first silicon nitride layer and said pad oxide layer to form a patterned first silicon nitride layer to expose said trench region by using said patterned photoresist layer;

removing said patterned photoresist layer;

etching said semiconductor substrate to form said trench by using said patterned first silicon nitride layer as an etching mask;

forming a liner layer on sidewalls and a bottom of said trench;

forming a second silicon nitride layer on said first silicon nitride layer and said liner layer;

forming a polysilicon layer on said second silicon nitride layer;

forming a first silicon dioxide layer on said polysilicon layer, thereby filling said trench with said first silicon dioxide layer;

performing a chemical mechanical polishing to said first silicon dioxide layer using a poly slurry, said poly slurry enabling a polishing rate of polysilicon to be higher than that of silicon dioxide, and a polishing rate of said polysilicon to be higher than that of silicon nitride, said second silicon nitride layer acting as a polishing-stop layer, thereby forming a silicon dioxide protrusion above a surface of said second silicon nitride layer;

oxidizing said polysilicon layer to form a second silicon dioxide layer;

removing said first silicon nitride layer and said second silicon nitride layer;

forming silicon nitride spacers on corners of said silicon dioxide protrusion and said second silicon dioxide layer;

removing said pad oxide layer; and removing said spacers.

13. The method according to claim 12, wherein said second silicon nitride layer has a thickness of about 30–100 angstroms.

14. The method according to claim 12, wherein said polysilicon layer has a thickness of about 100–700 angstroms.

15. The method according to claim 12, wherein said poly slurry enables a ratio of a polishing selectivity of said polysilicon layer to that of said first silicon dioxide layer to be 30–60.

16. The method according to claim 12, wherein said poly slurry enables a ratio of a polishing selectivity of said polysilicon layer to that of said second silicon nitride layer to be 40–100.

17. The method according to claim 12, wherein said polysilicon layer is transferred into said second silicon dioxide layer by performing thermal oxidization.

18. The method according to claim 12, wherein said step of forming silicon nitride spacers comprises:

forming a third silicon nitride layer on said pad oxide layer; and anisotropic etching said third silicon nitride layer.

19. The method according to claim 18, wherein said third silicon nitride layer is formed by LPCVD.

20. The method according to claim 12, wherein said silicon nitride spacers are removed by hot phosphoric acid.

* * * * *